United States Patent [19]

Dutt et al.

[11] 4,343,674

[45] Aug. 10, 1982

[54] MONITORING INDIUM PHOSPHIDE SURFACE COMPOSITION IN THE MANUFACTURE OF III-V SEMICONDUCTOR DEVICES

[75] Inventors: Bulusu V. Dutt, Parsippany; Vassilis G. Keramidas, Warren; Henryk Temkin, New Providence, all of N.J.

[73] Assignee: Bell Telephone Laboratories, Incorporated, Murray Hill, N.J.

[21] Appl. No.: 244,130

[22] Filed: Mar. 16, 1981

[51] Int. Cl.$^3$ ............................................. C30B 19/10
[52] U.S. Cl. ..................................... 156/601; 156/624
[58] Field of Search ............ 156/601, 624, DIG. 103; 252/62.36 A; 148/115, 171, 175

[56] References Cited

U.S. PATENT DOCUMENTS 3,565,702  2/1971  Nelson ................................. 148/172
3,677,836  7/1972  Lorenz ......................... 252/62.36 A

FOREIGN PATENT DOCUMENTS 49-46507 12/1974 Japan .................................. 156/624

OTHER PUBLICATIONS

M. B. Panish, "Heterostructure Injection Lasers", Proceedings of the IEEE, vol. 64, No. 10, Oct. 1976, pp. 1512-1540.
M. B. Panish et al., "Preparation of Multilayer Heterostructures...", Metallurgical Transactions, vol. 2, 1971, pp. 795-801.

Primary Examiner—Hiram Bernstein
Attorney, Agent, or Firm—Peter A. Businger

[57] ABSTRACT

Indium phosphide stoichiometry in III-V semiconductor devices is sensitive to processing conditions during liquid phase epitaxy deposition. Disclosed is a method for determining indium-to-phosphorus ratio in an n-type indium phosphide semiconductor surface layer by monitoring photoluminescence at an absorption band at or near 0.99 electron volt.

9 Claims, 1 Drawing Figure

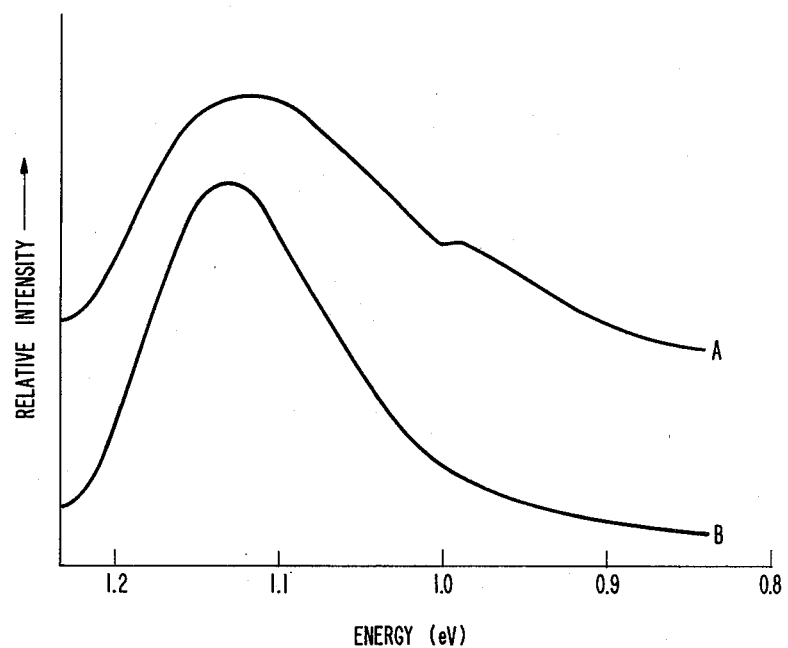

MONITORING INDIUM PHOSPHIDE SURFACE COMPOSITION IN THE MANUFACTURE OF III-V SEMICONDUCTOR DEVICES

CROSS-REFERENCE TO RELATED APPLICATIONS

Concurrently filed are patent applications Ser. No. 244,133 and Ser. No. 244,134.

TECHNICAL FIELD

The invention is concerned with the manufacture of III-V semiconductor devices and, more particularly, with monitoring indium phosphide surface composition.

BACKGROUND OF THE INVENTION

III-V semiconductor materials are being used, e.g., in the manufacture of semiconductor optical devices which either emit light in response to an applied voltage or produce a voltage in response to incident light; examples of such opto-electronic devices are light-emitting diodes, super-radiant diodes, laser diodes, photodetectors, opto-isolators, and phototransistors. Particularly well developed in III-V semiconductor opto-electronics are devices consisting of a gallium arsenide or indium phosphide substrate on which a light-emitting or light-detecting p-n junction is formed in epitaxially deposited layers of suitably doped gallium arsenide, indium phosphide, or other lattice-matched III-V material. Such opto-electronic devices are typically produced in the form of tiny chips having electrodes attached to two facets which are parallel to the epitaxial layers. A survey of light-emitting diode and laser technology may be found in the paper by M. B. Panish, "Heterostructure Injection Lasers", *Proceedings of the Institute of Electrical and Electronics Engineers,* Vol. 64, No. 10 (October 1976), pp. 1512–1540.

For the deposition of epitaxial layers in the manufacture of III-V semiconductor devices, methods known as liquid phase epitaxy (LPE) and molecular beam epitaxy (MBE) have been used successfully, the former being considered particularly suitable for commercial production. Such production is facilitated by the use of apparatus and methods for the deposition of successive layers as described, e.g., in U.S. Pat. No. 3,565,702, issued Feb. 23, 1971 to H. Nelson and in the paper by M. B. Panish et al., "Preparation of Multilayer LPE Heterostructures with Crystalline Solid Solutions of $Al_x$ $Ga_{1-x}As$: Heterostructure Lasers", *Metallurgical Transactions,* Vol. 2, March 1971, pp. 795–801.

Device manufacture may involve processing at elevated temperatures at which semiconductor constituent elements may have widely differing volatility; this is a particular concern in the case of epitaxial III-V materials containing indium phosphide. To aid in the realization of precisely specified composition, there is a need for an analytic tool for determining indium-to-phosphorus ratio at the surface of a III-V material.

SUMMARY OF THE INVENTION

To determine indium-to-phosphorus ratio in a III-V semiconductor surface layer, photoluminescence is monitored at an absorption band near 0.99 electron volt. Luminescence is generated by excitation with radiation having wavelength corresponding to an energy which is greater than the band gap of indium phosphide.

BRIEF DESCRIPTION OF THE DRAWING

The FIGURE is a diagram of photoluminescence intensity as a function of energy as obtained from two different layers of epitaxially deposited indium phosphide material.

DETAILED DESCRIPTION

In the manufacture of III-V semiconductor devices, III-V materials such as, e.g., gallium arsenide, gallium arsenide phosphide, gallium arsenide indium phosphide, and indium phosphide are typically deposited on a suitable substrate. Deposition processes such as, in particular, liquid phase epitaxy may involve processing at temperatures in a preferred range of 600 to 680 degrees C., i.e., at temperatures at which indium phosphide dissociates incongruently. Accordingly, there is a concern with disproportionate loss of phosphorus, such loss being detrimental to electrical properties and optical performance of indium phosphide and other phosphorus containing III-V devices.

In accordance with the invention, photoluminescence is used to evaluate the stoichiometry of a III-V semiconductor surface layer which consists essentially of n-type indium phosphide. (Among typical dopant materials are sulfur and tin in a concentration up to approximately $10^{19}$ per cubic centimeter.) A surface layer may be at the surface of a bulk crystal or, more typically, at the surface of an epitaxially grown layer. Thickness of a surface layer whose composition is evaluated in accordance with the invention is on the order of one micrometer.

Evaluation of surface composition is by monitoring photoluminescence near 0.99 electron volt; photoluminescence being conveniently generated, e.g., by irradiation with laser radiation having a wavelength corresponding to an energy which is greater than the band gap of indium phosphide. (This band gap is at an energy of approximately 1.4 electron volt, corresponding to a wavelength of approximately 0.9 micrometer.) For example, a krypton laser operating at a wavelength of 0.6741 micrometer is convenient for this purpose; alternatively, a miniature solid state laser such as, e.g., a gallium aluminum arsenide laser may be used.

Monitoring of intensity may be by means of a spectrometer tuned to wavelengths corresponding to energies in the preferred range of 0.90 to 1.05 electron volt. Or, intensity may be measured integrated over any portion or the entirety of the preferred range. Radiation in this range may be conveniently isolated by means of a bandpass filter.

In the interest of adequate sensitivity, measurements are preferably carried out at a temperature which does not exceed a temperature of approximately 200 Kelvin. At such temperatures, sensitivity of the method is sufficient to detect vacancy densities as low as approximately $5 \times 10^{16}$ per cubic centimeter.

The method has been determined to be essentially independent of concentration of n-type dopants such as, e.g., tin and sulfur. For example, readings are essentially unaffected by the presence of tin in a typical range of $5 \times 10^{16}$ to $8 \times 10^{18}$ per cubic centimeter.

The method provides for nondestructive evaluation of device surface quality and may be used, e.g., as a quality control in device fabrication. Typically, the method may be used for spot-checking deposited layers and, based on monitored indium-to-phosphorous ratio, processing conditions such as, e.g., composition of an ambient atmosphere and temperature in liquid phase epitaxy processing may be adjusted for optimal surface quality.

Efficacy of the method is illustrated by the following examples.

EXAMPLE 1

A sample was prepared by liquid phase epitaxy deposition of a layer of indium phosphide in an atmosphere of hydrogen. Dopant concentration was $10^{17}$ per cubic centimeter tin. The sample was immersed in liquid nitrogen and the epitaxial layer was exposed to radiation produced by a krypton laser. Photoluminescene intensity as a function of energy was determined by a spectrometer; the result is graphically represented by curve A in the FIGURE.

EXAMPLE 2

From the same melt a second sample was prepared in an atmosphere of hydrogen which contained phosphorous vapor; curve B in the FIGURE represents the corresponding photoluminescent intensity.

Based on a separate cadmium diffusion experiment, it was determined that the peak at an energy of approximately 1.12 electron volt is due to native acceptor-impurity complexes; this peak is not significant as to device properties. The peak at an energy of approximately 0.99 electron volt, on the other hand, provides reliable information, in accordance with the invention, about indium-to-phosphorus ratio in a surface layer; its elimination in Example 2 as compared with Example 1 indicates an essentially stoichiometric indium-to-phosphorus ratio.

What is claimed is:

1. A process for manufacturing III-V semiconductor devices, said process including the production of material which consists essentially of n-type indium phosphide, said process including determining indium-to-phosphorus ratio in at least a portion of a surface of said material by (1) irradiating said portion of a surface with electromagnetic radiation which is here designated as first electromagnetic radiation and which has a spectral component whose energy is larger than the energy of the bandgap of indium phosphide, and (2) monitoring the intensity of electromagnetic radiation which is here designated as second electromagnetic radiation and which emanates from said portion, monitoring being in at least a portion of the energy interval from 0.90 to 1.05 electron volt.

2. Process of claim 1 in which said material is in the form of an epitaxial layer.

3. Process of claim 2 in which said epitaxial layer is deposited by liquid phase epitaxy.

4. Process of claim 1 comprising cooling said material to a temperature which is less than or equal to 200 Kelvin.

5. Process of claim 1 in which said second radiation is monitored by means of a spectrometer.

6. Process of claim 1 in which said second radiation is filtered by means of at least one bandpass filter.

7. Process of claim 1 including adjustment of processing parameters in response to said monitoring.

8. Process of claim 7 in which composition of an atmosphere is adjusted in response to said monitoring.

9. Process of claim 7 in which a liquid phase epitaxy processing temperature is adjusted in response to said monitoring.

* * * * *